United States Patent [19]

Shimoyama et al.

[11] Patent Number: 5,789,923
[45] Date of Patent: Aug. 4, 1998

[54] BATTERY REMAINING CAPACITY MEASURING DEVICE

[75] Inventors: Kenichi Shimoyama; Tsutomu Saigo, both of Susono, Japan

[73] Assignee: Yazaki Corporation, Tokyo, Japan

[21] Appl. No.: 738,911

[22] Filed: Oct. 28, 1996

[30] Foreign Application Priority Data

Oct. 30, 1995 [JP] Japan .................. 7-281876

[51] Int. Cl.$^6$ .................................. G01N 27/416
[52] U.S. Cl. ................. 324/427; 324/429; 320/48; 364/481; 340/636
[58] Field of Search .................. 324/426, 427, 324/428, 429, 433, 771; 320/44, 48; 364/481, 483, 550, 551.01; 340/636

[56] References Cited

U.S. PATENT DOCUMENTS

| | | | |
|---|---|---|---|
| 4,849,700 | 7/1989 | Morioka et al. | 324/427 |
| 5,287,286 | 2/1994 | Ninomiya | 364/481 |
| 5,321,627 | 6/1994 | Reher | 364/483 |
| 5,404,106 | 4/1995 | Matsuda | 324/427 |
| 5,479,085 | 12/1995 | Honda et al. | 324/48 |
| 5,592,094 | 1/1997 | Ichikawa | 324/427 |
| 5,617,324 | 4/1997 | Arai | 364/483 |
| 5,672,973 | 9/1997 | Aria et al. | 324/427 |

*Primary Examiner*—Diep N. Do
*Attorney, Agent, or Firm*—Oblon, Spivak, McClelland, Maier & Neustadt, P.C.

[57] ABSTRACT

In a battery remaining capacity measuring device, a current sensor and a voltage sensor detect currents flowing through a load and voltages at both terminals of a battery. A voltage-current changing tendency calculating section collects the detected terminal voltages and the detected currents at every predetermined time, and averages a plurality of terminal voltage values and a plurality of current values at each time when the terminal voltage values and the current values are collected to a predetermined number. A voltage-current approximating line calculating section calculates a voltage-current approximating line using a method of least square having currents as the x-axis and voltages as the y-axis based on the predetermined number of the averaged current values and the averaged voltage values at each time when the averaged voltage values and current values reach the predetermined number. A remaining capacity calculating section estimates a voltage value of the voltage-current approximating line corresponding to a reference current value at each time when the voltage-current approximating line is determined.

3 Claims, 7 Drawing Sheets

BATTERY REMAINING CAPACITY MEASURING DEVICE

BACKGROUND OF THE INVENTION

This invention relates to a battery remaining capacity measuring device, more particularly, to a battery remaining capacity measuring device for preferably setting coordinates axes of an approximating line when the present terminal voltages of a battery is determined by the approximating line using a method of least square.

In general, batteries have different discharge characteristics depending upon variations of a load connected thereto, an ambient temperature, change of characteristics over time and the like. Accordingly, a remaining capacity of each battery is different from others depending upon the variation of the load, the ambient temperature, the change of characteristics over time and the like.

Hence, in the remaining capacity measuring device mounted on an electric vehicle, voltages at both terminals of the battery and discharge currents flowing through the load while the vehicle is running are collected at every predetermined time, and each time when voltages at both terminals and discharge currents are collected to a predetermined number, a plurality of terminal voltages and a plurality of discharge currents are averaged respectively.

Figure 1:
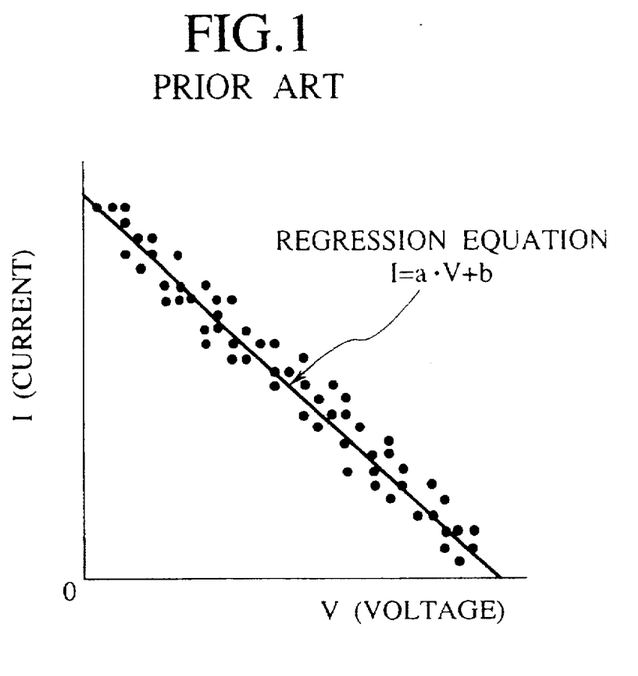
FIG. 1 is an explanatory graph of a conventional approximating line.

Whereafter, each time when the averaged voltages at both terminals (hereinafter called "voltage data") and discharge currents (hereinafter called "current data") reach a predetermined number, as shown in FIG. 1, coordinate points representing each voltage data and current data are dispersed on a V-coordinate system where the y-axis represents current values and the x-axis represents voltage values, and when these values indicate a strong negative correlation (for example, equal to or less than −0.9), the approximating line I=a·V+b is determined to minimize the errors between these measured points and the approximating line by the method of least square, and thereafter, the voltage of the x-axis at the interception point of the predetermined current value Io and the approximating line is estimated as the present remaining capacity voltage of the battery.

This approximating line I=a·V+b wherein sampled voltage value is x and current value is y, the tendency, more commonly known as the slope a and the intercept b are obtained by the following equations (1) and (2).

$$a = S(xy)/S(xx) = \text{the product-sum of sampled voltage values and current values/the sum of squares of sampled voltage value} \quad (1)$$

$$b = \bar{y} - a \cdot \bar{x} = \text{the average value of the sampled current values } -a \cdot \text{ the average value of the sampled voltage values} \quad (2)$$

Figure 2:
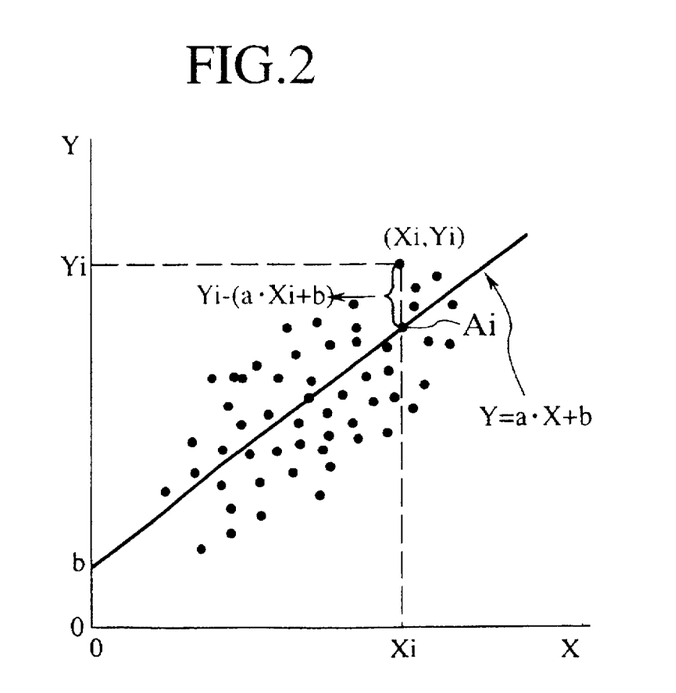
FIG. 2 is a graph explaining a method of least square.

However, the method of least square, as shown in FIG. 2, is for dispersing the actually measured values following the changes of values of the cause system on a scattered graph having the vertical line (y-axis) for obtaining the result, and the horizontal line (x-axis) as the cause system for obtaining the cause. Thereafter, the square of the difference between each actually measured value (Yi, Xi) on the scattered graph and the lines $[Yi-(a \cdot Xi+b)]^2$ indicating each predicted value Ai corresponding to each actually measured value on the scattered graph is determined, and the approximating line Y=a·X+b is obtained to determine a and b to minimize the sum so that the value of the Y-axis has a value with the least variation when Y as the result system is estimated from the X as the cause system. In such the conventional remaining capacity measuring device as described above, however, the measuring points which indicate each voltage data and each current data having the x-axis as the voltage axis and the Y-axis as the current axis are dispersed in order to obtain the accurate voltage, the approximating line is determined by the method of least square to have the value of the voltage axis based on this approximating line and a reference current value as the estimated voltage.

That is, although the voltage is the result system, the voltage axis is taken for the x-axis as the cause system.

Figure 3:
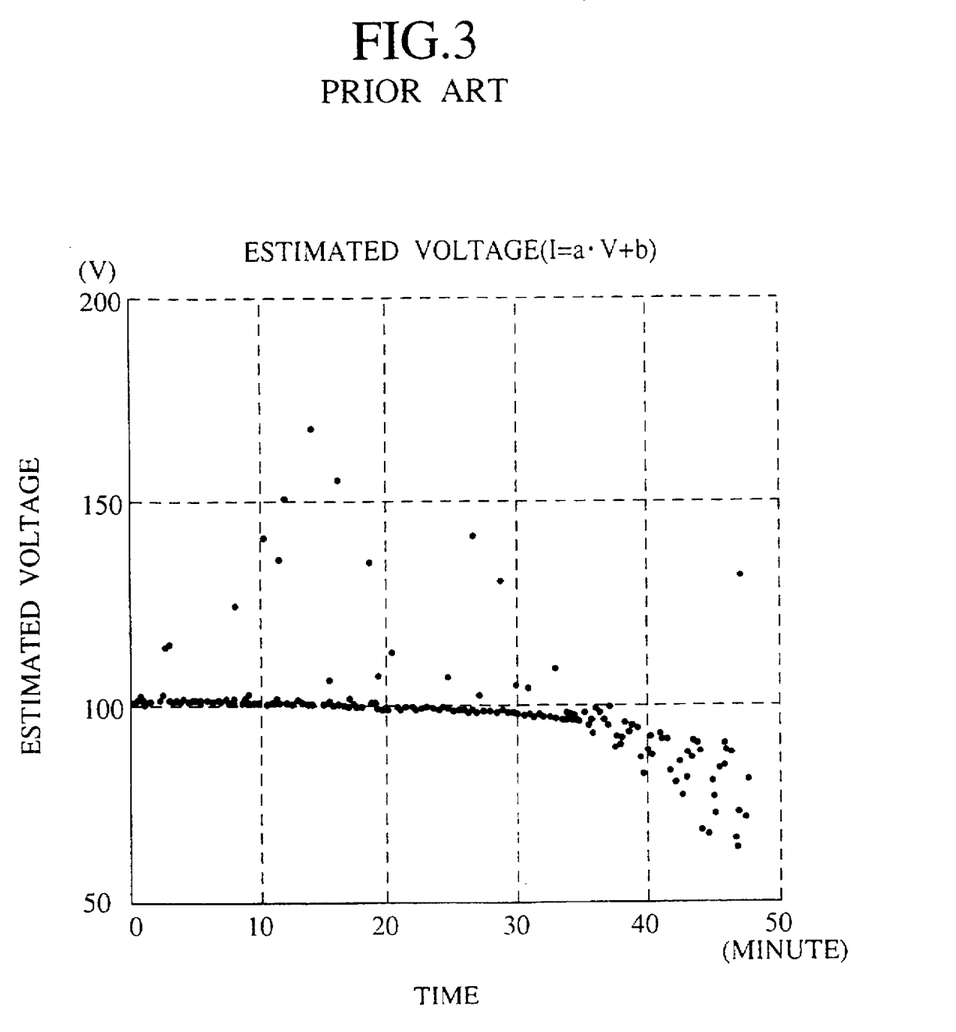
FIG. 3 is an explanatory graph showing a problem in a conventional device.

Therefore, for example, when the strong negative correlation equal to or less than −0.9 is indicated, the estimated voltage obtained based on the approximating line by the method of least square is collected corresponding to the time axis, which results the data having some variations as shown in FIG. 3. Consequently, there exists a problem that the obtained estimated voltage lacks reliability.

SUMMARY OF THE INVENTION

This invention is made to solve the problems as described above, and it is therefore an object of this invention to provide a battery remaining capacity measuring device capable of obtaining an estimated voltage with high reliability.

To achieve the above mentioned object, this invention provides a battery remaining capacity measuring device comprising: current-voltage detecting means for detecting currents flowing through a load and voltages at both terminals of a battery; means for calculating voltage-current changing tendency by collecting detected terminal voltages and detected currents at every predetermined time, and averaging a plurality of terminal voltage values and a plurality of current values at each time when terminal voltage values and current values are collected to a predetermined number; voltage-current approximating line calculating means for calculating a voltage-current approximating line using a method of least square having currents as x-axis and voltages as y-axis based on the predetermined number of averaged voltage values and averaged current values at each time when the averaged voltage values and the averaged current values reach the predetermined number; and remaining capacity calculating means for estimating a voltage value of the voltage-current approximating line corresponding to a reference current value as a present estimated voltage of the battery at each time when the voltage-current approximating line is determined.

According to this invention, the voltage as a result is estimated by a general method of least square having x-axis as the cause system and y-axis as the result system, thereby the estimated voltage is obtained with high accuracy.

According to a preferable aspect of the invention, the voltage-current approximating line calculating means determines a tendency of the voltage-current approximating line by dividing product-sum of the predetermined number of the averaged current values and the predetermined number of the averaged voltage values by sum of squares of the predetermined number of the averaged current values, and determines an intercept of the voltage-current approximating line by subtracting integrated value of the tendency and the predetermined number of the averaged current values from the predetermined number of the averaged voltage values.

According to a preferable aspect of the invention, the battery remaining capacity measuring device further comprises a display section for displaying an estimated voltage estimated by the remaining capacity calculating section.

The nature, principle and utility of the invention will become more apparent from the following detailed description when read in conjunction with the accompanying drawings.

DESCRIPTION OF THE PREFERRED EMBODIMENTS

Preferred embodiments of this invention will be clearly understood from the following description by referring to the accompanying drawings.

The following embodiment is made with regard to a battery remaining capacity measuring device for use in measuring a remaining capacity of a battery mounted on an electric vehicle.

Figure 4:
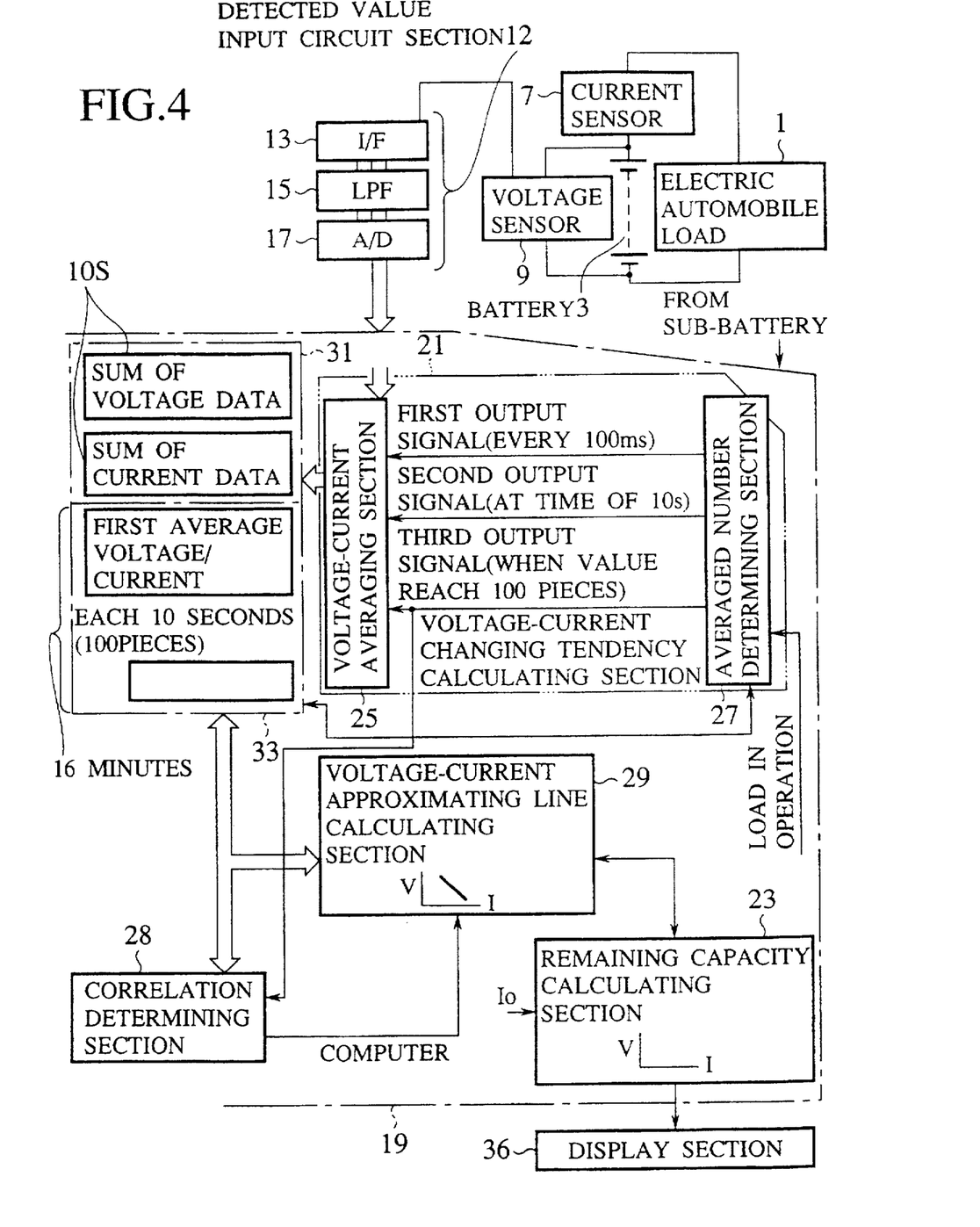
FIG. 4 is a schematic arrangement of a battery remaining capacity measuring device according to an embodiment of this invention.

FIG. 4 shows a schematic arrangement according to an embodiment of this invention. Referring to FIG. 4, reference numeral 1 denotes an electric vehicle load (hereinafter simply called "a load"), reference numeral 7 denotes a current sensor, and reference numeral 9 denotes a voltage sensor for detecting voltages at both terminals of a battery 3.

Reference numeral 12 denotes a detected value input circuit section. The detected value input circuit section 12 comprises an interface (I/F) 13, a low-pass filter (LPF) 15, and an analogue/digital converter (A/D) 17, receives discharged currents (hereinafter called "current data") and the voltages at both terminals (hereinafter called "voltage data") detected by the current sensor 7 and the voltage sensor 9, and converts them into digital information after removing noise therefrom.

Reference numeral 19 denotes a computer. The computer 19 has a program arrangement consisting of a voltage-current changing tendency calculating section 21, a remaining capacity calculating section 23, a correlation determining section 28, a voltage-current approximating line calculating section 29 and the like. The computer 19 displays an estimated voltage on a display section 36, wherein the estimated voltage is determined by the approximating line on a scattered graph having the voltage as the y-axis. In addition, the computer 19 follows the operation of an ignition key and is placed into operation by power from a sub-battery.

The voltage-current changing tendency calculating section 21 comprises an average number determining section 27 and a voltage-current averaging section 25.

The voltage-current averaging section 25 samples the current data and the voltage data each time when a first output signal is output from the average number determining section 27. Each time sampling is performed, the sampled values are added to the previous values to be stored in a memory 31. Furthermore, each time when a second output signal is output from the average number determining section 27, the total sum of the present voltage data and the total sum of the present current data are respectively averaged based on the number of additions and stored in the memory 33.

The average number determining section 27 outputs the first output signal to the voltage-current averaging section 25 at every 100 ms during a load operation signal indicating that the electric vehicle is in operation is output. In addition, the average number determining section 27 outputs the second output signal to the voltage-current averaging section 25 each time when the added numbers of the detected current and voltage amount to 100 pieces (each time 10 seconds elapse). Further, the third output signal is output to the voltage-current averaging section 25 and the correlation determining section 28 when each 100 pieces of the average current values and the average voltage values are stored in the memory 33.

Namely, the voltage-current averaging section 25 and the average number determining section 27 obtain the dispersed data consisting of the discharged currents and voltages from the battery 3 each predetermined period of time.

Each time when the third output signal is output, the voltage-current approximating line calculating section 29 has a plurality of the averaged voltage values as the y-axis and averaged current values as the x-axis, and takes the total sum of squares of errors between the presumed approximating line $V = a \cdot I + b$ and these actually measured values to obtain a, b which minimize the total sum of the square. The voltage-current approximating linear function $V = a \cdot I + b$ is determined based on these a, b.

Each time when the voltage-current approximating line $V = a \cdot I + b$ is determined by the voltage-current approximating line calculating section 29, the remaining capacity calculating section 23 displays the voltage value of the approximating line $V = a \cdot I + b$ corresponding to the predetermined reference current Io as the present estimated voltage of the battery 3 on the display section 36.

Figure 5:
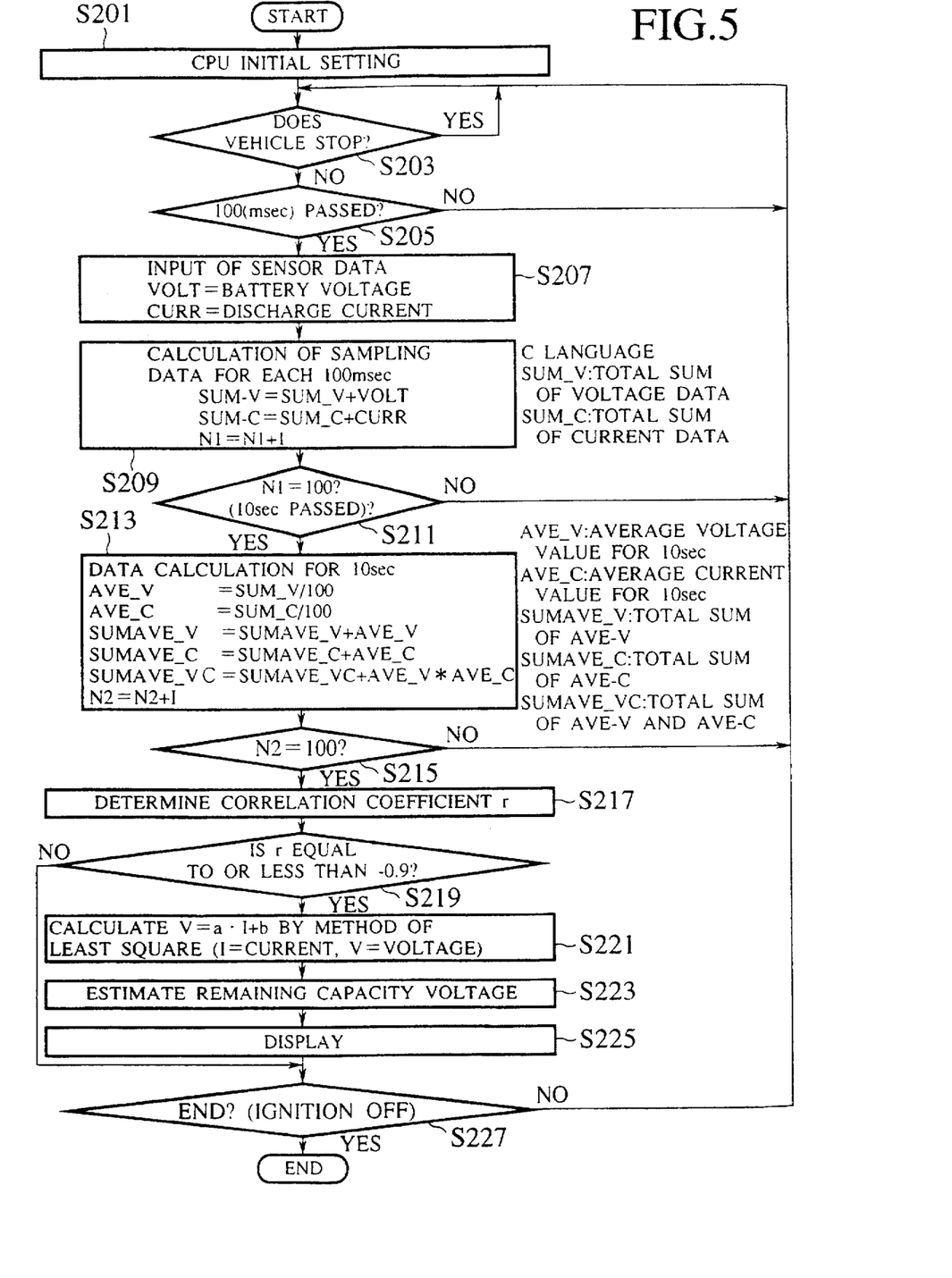
FIG. 5 is a flow chart explaining an operation of a battery remaining capacity measuring device according to an embodiment of this invention.

The description will now proceed to a battery remaining capacity measuring device as arranged above by referring to a flow chart illustrated in FIG. 5.

First, the computer 19 checks each section when power is supplied from the sub-battery to the computer which follows the operation of the ignition key, and carries out the initial setting such as storing a program in a ROM into a RAM and the like (Step 201). The average number determining section 27 determines whether or not the electric vehicle is in standstill condition based on the load operation signal (Step 203).

The load operation signal is output when, for example, an amount of operation of an accelerator, an amount of a speed pulse, an amount of rotation of windshield wipers or the like is equal to or greater than a predetermined value, or the compressor of an air conditioner is in switching operation. The average number determining section 27 determines that the electric vehicle is in operation when the load operation signal is input, whereas the section 27 determines that the electric vehicle is in standstill condition when the load operation signal is not input.

Thereafter, when the electric vehicle is not in standstill condition, that is, when it is determined the vehicle is in operation, the average number determining section 27 determines whether or not 100 ms have elapsed (Step 205). When it is determined in Step 205 that the 100 ms have elapsed, the average number determining section 27 outputs the first output signal to the voltage-current averaging section 25. Then, the voltage-current averaging section 25 reads voltage data (VOLT) and current data (CURR) (Step 207), adds the sampling data (current data and voltage data) to the previous values, stores as the total sum values of voltage data and current data in the memory 31, and counts the number of additions (Step 209).

Then, the average number determining section 27 determines whether or not a count value N amounts to 100, that is, 10 seconds have elapsed (Step 211). When determined in Step 211 that 10 seconds have not elapsed, then the process goes back to Step 203 where the current-voltage averaging section 25 adds the current data and voltage data for every 100 ms in the above described manner and counts the number of additions.

On the other hand, when the average number determining section 27 determines at Step 211 that 10 seconds have elapsed, that is, the detected current and voltage are added 100 times, the average number determining section 27 outputs the second output signal to the voltage-current averaging section 25, averages 100 pieces of the detected currents (the total sum of current data) and the detected voltages (the total sum of voltage data), respectively, and stores them in the memory 33 (Step 213). Thereafter, determination is made whether or not the average value amounts to 100 pieces, respectively (Step 215). When the 100 pieces are not determined at Step 215, the process goes back to Step 203 where 100 pieces of current data and voltage data for the elapse of 10 seconds are added to determine the average value based on the number of additions.

When the 100 pieces of the average data are determined by the average number determining section 27 at Step 215, the third signal is output to the correlation determining section 28 to determine the correlation coefficient r (Step 217).

Then, the correlation determining section 28 determines whether or not the correlation coefficient is equal to or less than −0.9(Step 219), and when determined it is equal to or less than −0.9, the voltage-current approximating line calculating section 29 is driven.

The voltage-current approximating line calculating section 29 reads 100 pieces of the average voltage values and the average current values from the memory 33, takes the total sum of squares of errors between the presumed approximating line V=a·I+b and these actually measured values, and determines a ,b which minimize the total sum of squares. Then, the approximating line V=a·I+b is determined based on these a, b (Step 221).

This approximating line V=a·I+b is obtained by the following equations (3) and (4), where x is sampled currant value and y is voltage value.

$$a = S(xy)/S(xx) \quad (\because xx \leftarrow yy) = \text{the product-sum of sampled current values and voltage values/sum of squares of sampled current values} \quad (3)$$

$$b = \bar{y} - a\bar{x} = \text{the average value of the sampled voltage values} - a \cdot \text{the average value of the sampled current values} \quad (4)$$

Figure 6:
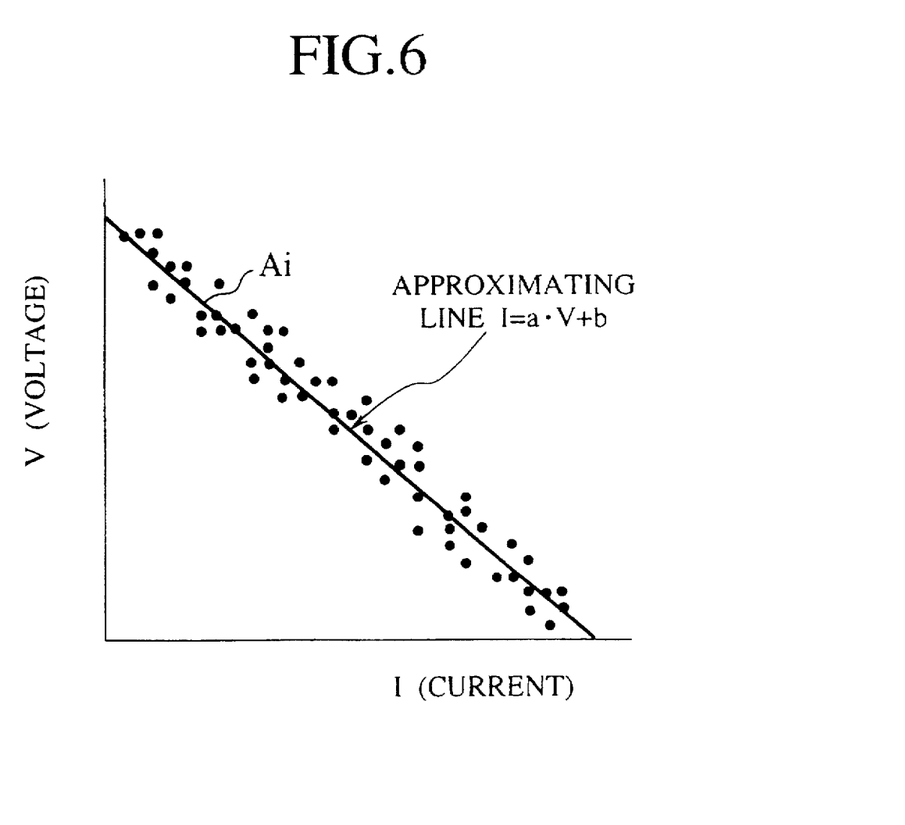
FIG. 6 is a scattered graph for use in an embodiment of this invention.

Namely, as shown in FIG. 6, the coordinates value corresponding to each actually measured value Ai (Vi, Ii) is obtained on a scattered graph having the y-axis for voltage as an obtained result and the x-axis for current as a cause system.

Next, the remaining capacity calculating section 23 displays the voltage values of the approximating line V=a·I+b (Step 223) corresponding to the preset reference current Io on the display section 36 as the estimated voltage of the battery 3 (Step 225).

Thereafter, the process is completed or not, that is, whether the ignition key is turned OFF or not is determined (Step 227). When it is not completed, the process moves to the Step 203 where, while the electric vehicle is in operation, each time the dispersed data of voltages and currents within a predetermined period of time are determined, a V-I approximating line V=a·I+b which has the minimum errors to these dispersed data is determined to estimate the voltage in the same manner as described above.

Figure 7:
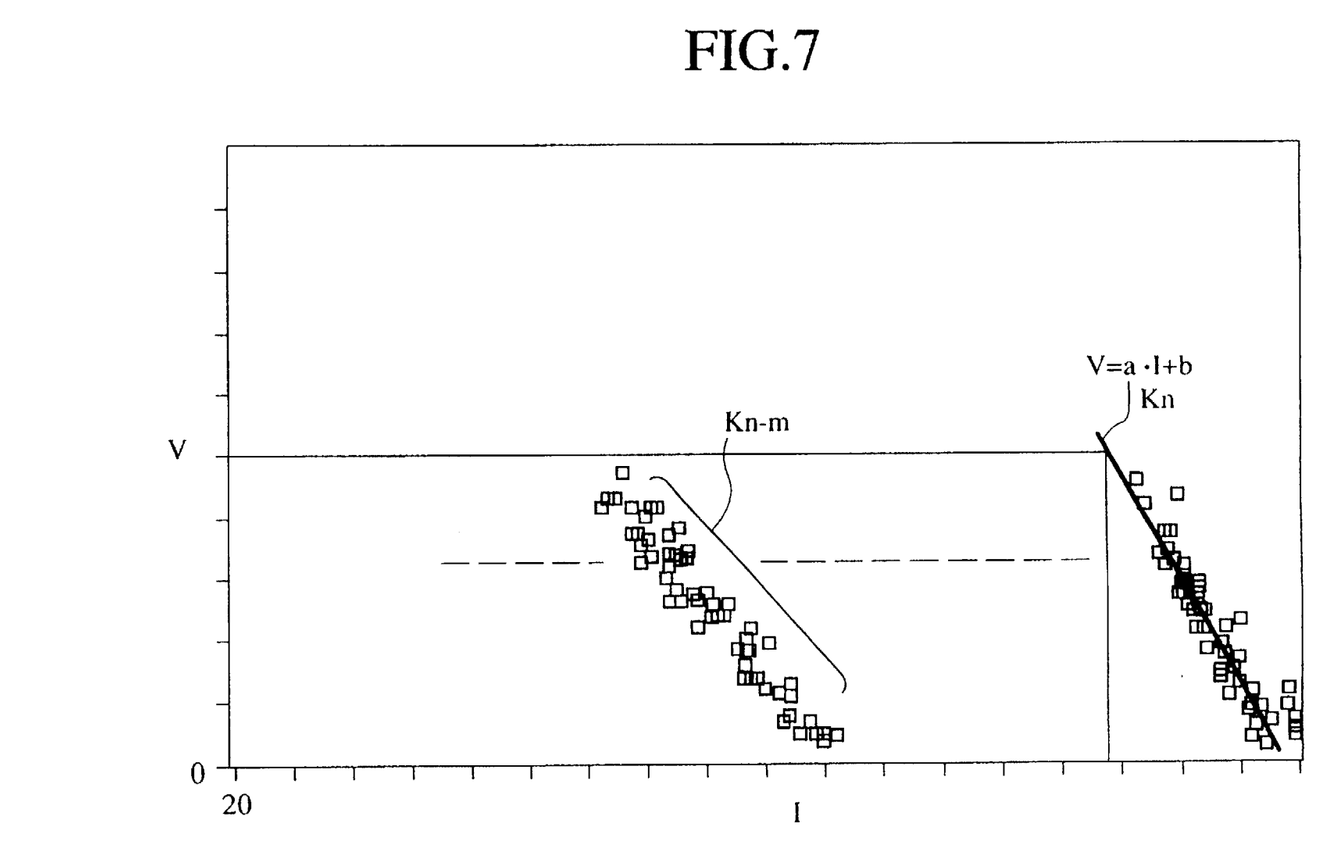
FIG. 7 is a graph explaining the approximating line following the time elapse of this invention.

Namely, as shown in FIG. 7, in the coordinates system where y-axis is the voltage axis and x-axis is the current axis, the voltage is estimated by determining the approximating line $K_n$ − the approximating line $K_{n-m}$ following the elapse of time.

Accordingly, since the voltage is estimated by the approximating line V=a·I+b where the x-axis is the current as the cause system and the y-axis is as the result system following the elapse of time, the estimated voltage has no dispersion.

Figure 8:
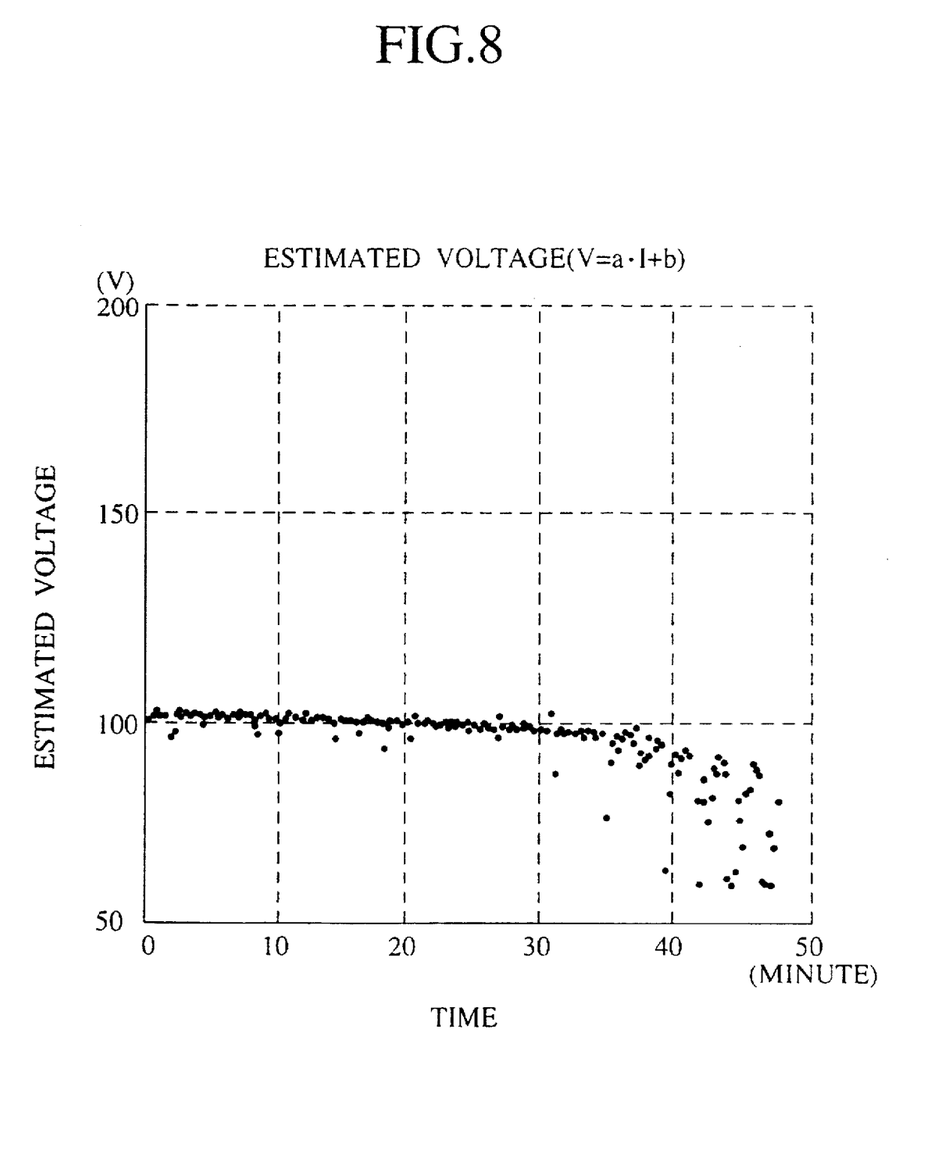
FIG. 8 is an explanatory graph showing a collected result of the estimated voltage of this invention.

For example, the estimated voltage is collected corresponding to the time axis, during the elapse of 30 minutes, the estimated voltage as shown in FIG. 8 is concentrated on the line which has an approximate predetermined tendency.

The graph in FIG. 8 has extremely less variations of data compared with the graph shown in FIG. 3 where the estimated voltage is collected in the conventional manner.

Namely, even if the correlation between the plurality of average voltages and the plurality of average currents is low (for example −0.8), regarding the approximating line Y=a·X+b, the value on the voltage axis value (y-axis) as the result system is estimated on the basis of the value on the current axis value (x-axis) as the cause system, therefore, it is possible to obtain the estimated voltage with no dispersions as illustrated in FIG. 8. Consequently, the accurate estimated voltage is obtained even if the correlation is low.

As described above, according to a preferred aspect of this invention, each time when the averaged voltage values and the averaged current values reach the predetermined number, the voltage-current approximating line is determined by the method of least square having the current as the x-axis and the voltage as the y-axis based on the predetermined number of the averaged voltage values and the averaged current values. Then, each time the voltage-current approximating line is obtained, the voltage value on the voltage-current approximating line corresponding to the reference current value is estimated as the present estimated voltage of the battery. Consequently, the resulted voltage is estimated by using the general least square method having the x-axis as the cause system and the y-axis as the result system, therefore, the estimated voltage is obtained with high accuracy.

It should be understood that many modifications and adaptations of the invention will become apparent to those skilled in the art and it is intended to encompass such obvious modifications and changes in the scope of the claims appended hereto.

What is claimed is:

1. A device which estimates remaining capacity of a battery supplying current to a load, comprising:

a current-voltage input section including detectors detecting currents flowing through the load and a voltage across both terminals of the battery and providing data indicating detected terminal voltages and detected currents;

a calculating section receiving the data indicating the detected terminal voltages and detected currents and outputting averaged voltage data relative to a predetermined number of terminal voltage data increments and averaged current data relative to the same predetermined number of current data increments received over a predetermined time period;

a voltage-current approximating line section receiving the averaged voltage data and the averaged current data and processing the averaged voltage data and the averaged current data to formulate a line approximating a voltage-current relationship using a method of least squares relative to a coordinate system with current as a x-axis variable and voltage a y-xis variable; and a remaining capacity section estimating a voltage value from the line approximating the voltage-current relationship, said estimated voltage value corresponding to a reference current value and representing estimated capacity of said battery each time said voltage-current approximating line is determined by said voltage-current approximating line section.

2. The device as claimed in claim 1, wherein said voltage-current approximating line calculating section determines a slope of said voltage-current approximating line by dividing a sum of products of a number of the averaged current data and a like number of the averaged voltage data by a sum of squares of the number of the averaged current data and determines an intercept of said voltage-current approximating line by subtracting a product of said slope and the number of the averaged current data from the number of the averaged voltage data.

3. The device as claimed in claim 1, further comprising a display displaying the estimated voltage value received from said remaining capacity calculating section.

* * * * *